United States Patent
Morishima (10) Patent No.: US 7,656,946 B2
(45) Date of Patent: Feb. 2, 2010

(54) PULSE WIDTH MODULATION AMPLIFIER

(75) Inventor: Morito Morishima, Fukuroi (JP)

(73) Assignee: Yamaha Corporation, Hamamatsu-shi (JP)

( * ) Notice: Subject to any disclaimer, the term of this patent is extended or adjusted under 35 U.S.C. 154(b) by 557 days.

(21) Appl. No.: 11/317,938

(22) Filed: Dec. 23, 2005

(65) Prior Publication Data

US 2006/0140090 A1 Jun. 29, 2006

(30) Foreign Application Priority Data

Dec. 28, 2004 (JP) .............................. 2004-379340
Nov. 30, 2005 (JP) .............................. 2005-345235

(51) Int. Cl.
*H03K 7/08* (2006.01)
*H03K 9/08* (2006.01)
(52) U.S. Cl. ..................... 375/238; 332/109; 332/112
(58) Field of Classification Search ................. 375/238; 332/109, 112
See application file for complete search history.

(56) References Cited

U.S. PATENT DOCUMENTS 5,119,045 A * 6/1992 Sato ............................ 332/109
5,789,975 A * 8/1998 Yoshida et al. ................. 330/10

FOREIGN PATENT DOCUMENTS

JP 59-183510 10/1984
JP HEI 3-36099 7/1991

* cited by examiner

*Primary Examiner*—Ted M Wang
(74) *Attorney, Agent, or Firm*—Pillsbury Winthrop Shaw Pittman LLP (57) ABSTRACT

The invention provides a pulse width modulation amplifier that includes a correction circuit, an envelope detector, a level detector, a PWM carrier generator, an interpolation arithmetic circuit, and a PWM circuit. The envelope detector detects an envelope of digital data to be input. The correction circuit performs distortion correction, frequency characteristic correction, and $\Delta\Sigma$ correction, for the input digital data. The level detector detects levels of the digital data supplied by the envelope detector. The PWM carrier generator gates a carrier signal having a frequency corresponding to the output of the level detector. The interpolation arithmetic circuit generates interpolation data synchronous with the carrier signal from the digital data. The PWM circuit converts the interpolation data into a pulse width modulation signal based on the carrier signal.

3 Claims, 8 Drawing Sheets

FIG. 8A  PLL DIFFERENTIAL CLOCK

FIG. 8B  PWM SIGNAL

FIG. 8C  LATCH OUTPUT

FIG. 8D  DIFFERENTIAL DRIVER INPUT

FIG. 8E  DIFFERENTIAL DRIVER OUTPUT

PULSE WIDTH MODULATION AMPLIFIER

PRIORITY CLAIM

Priority is claimed on Japanese Patent Application No. 2004-379340, filed Dec. 28, 2004 and Japanese Patent Application No. 2005-345235 filed Nov. 30, 2005, the content of which is incorporated herein by reference.

BACKGROUND OF THE INVENTION

1. Field of the Invention

The invention relates to a pulse width modulation amplifier that transforms pulse code modulation (PCM) data into a pulse width modulation (PWM) signal, and amplifies and outputs it, and in particular to a pulse width modulation amplifier that reduces output noise.

2. Description of Related Art

This type of pulse width modulation amplifier has the difficulty of performing a feedback operation for reducing output noise. When the feedback operation is not performed, jitter from a master clock is supplied as output noise as it is. Accordingly, a pulse width modulation amplifier of the prior art has used a technique, by which an output from the pulse width modulation amplifier is provided to a low pass filter to produce an analog signal. The analog signal is transformed to digital data by an analog to digital (A/D) converter, which is feedback to an input. See, for example, Patent Publication Sho 59-183510.

However, the technique has the drawback that since it needs an A/D converter, it has many components and complex circuits and is expensive.

On the other hand, in the prior art, amplifiers, which convert PCM data into an analog signal and then a PWM signal, have been widely used. Because the amplifiers are of analog type, they can easily perform a feedback operation of an output thereof. However, when the processing of PWM is performed based on analog processing, it has the disadvantage that it cannot follow miniaturization of semiconductor process.

As a prior art example coning a pulse width modulation amplifier, there is Utility Model Publication Hei 3-36099.

Accordingly, there is a need for overcoming the disadvantage.

SUMMARY OF THE INVENTION

The invention provides a pulse width modulation amplifier that reduces noise by using only a digital signal process without a feedback operation and an analog process, and supplies a high quality output. The pulse width modulation amplifier can be constructed at a low cost.

The first aspect of the invention is directed to a pulse width modulation amplifier. The pulse width modulation amplifier comprise a level detector for detecting a level of digital data to be input; a carrier generator for generating a carrier signal that successively a frequency corresponding to a detection result by the level detector; and a converter for converting digital data to a pulse width modulation signal based on the carrier signal.

The second aspect of the invention is directed to a pulse width modulation amplifier. The pulse width modulation amplifier comprises an envelope detector for detecting an envelope of digital data to be input; a level detector for detecting a level of the digital data from an out put of the envelope detector; a carrier generator for generating a carrier signal that successively increases a frequency corresponding to a detection result by the level detector; an interpolation data generator for generating interpolated data synchronous with the carrier signal from the digital data; and a convert for converting the interpolated data to a pulse width modulation signal based on the carrier signal.

The third aspect of the invention relates to a pulse width modulation amplifier. The pulse width modulation amplifier comprises a level detector for detecting a level of digital data to be input and outputting a detection signal when the level of the digital data becomes smaller than a predetermined value and remains smaller for a predetermined time; a carrier generator for generating a carrier signal that increases successively synchronous with an input timing of the digital data and, the carrier signal successively increasing having a frequency higher than the input timing when the detection signal from the level detector is received; an interpolation data generator for generating interpolation data synchronous with the carrier signal from the digital data; and a converter for converting the digital data to a pulse width modulation signal based on the carrier signal.

Preferably, the carrier generator generates twice as large a carrier frequency as the input pulse when the detection signal from the level detector is received.

The fourth aspect of the invention relates to a pulse width modulation amplifier. The pulse width modulation amplifier comprises a level detector for detecting a level of digital data to be input; a carrier generator for generating a carrier signal that increases successively synchronous with an inputting of the digital data; and a converter for converting the digital data to a pulse width modulation signal based on the carrier signal, and for outputting a duty and a frequency fixed signal, when a detection result by the level detector is zero data, direct current data or a small amount of data and the data is continuous.

Preferably, the pulse width modulation amplifier further comprises a clock generator for generating a differential clock synchronous with the carrier signal; a latch for reading in an output of the converter based on the differential clock and outputting a differential signal; an amplifier for amplifying the differential signal from the latch and outputting the amplified differential signal; and a differential driver driven by the amplified differential signal from the amplifier.

The fifth aspect of the invention relates to a pulse width modulation amplifier. The pulse width modulation amplifier comprises an absolute value output circuit for outputting an absolute value of digital data to be input; a period data output circuit for outputting period data corresponding to the absolute value from the absolute value output circuit; a carrier generator for generating a carrier signal that successively increase a frequency corresponding to the period data; and a converter for converting the digital data to a pulse width modulation signal based on the carrier signal.

Advantageously, the converter decides a pulse width y of the pulse width modulation signal based on the following equation $$y/(H+X\mathrm{abs})=(H\pm X\mathrm{abs})/2H,$$

where H is a maximum value of the digital data and Xabs is an absolute value of the digital data.

The invention can reduce noise by using only the digital signal processing without feedback or analog processing, which leads to the advantage that inexpensive pulse width modulation amplifiers can be constructed, and that a high quality and high efficiency output can be obtained.

DETAILED DESCRIPTION OF THE INVENTION

Referring to the figures, the embodiments in accordance with the invention will be described below.

Figure 1:
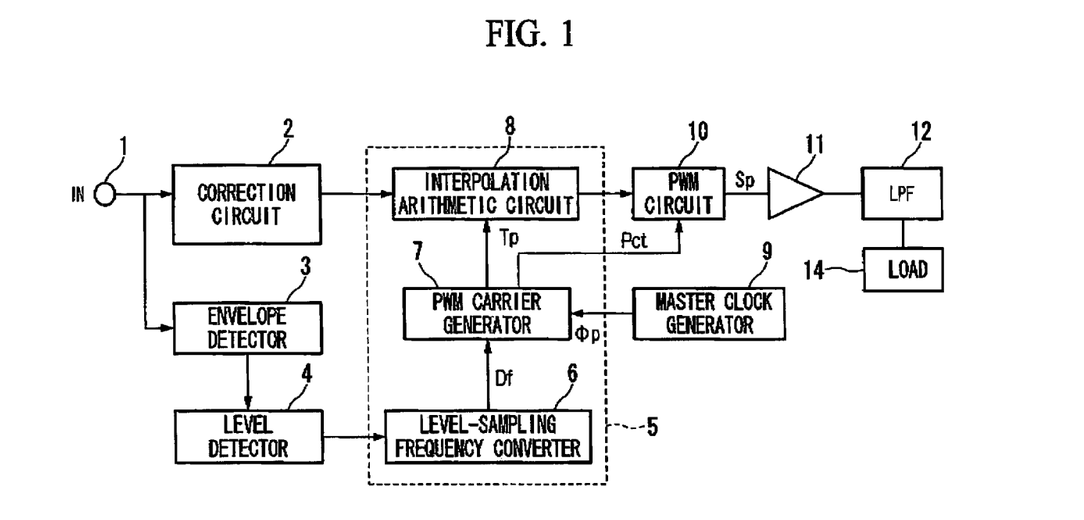
FIG. 1 is a block diagram for illustrating a structure of a pulse width modulation amplifier of a first embodiment in accordance with the invention.

FIG. 1 is a block diagram for illustrating a structure of a pulse width modulation amplifier of a first embodiment in accordance with the invention. The pulse width modulation amplifier is a circuit in which an input signal (digital) is converted to a pulse-width modulated signal to be amplified and output.

In FIG. 1, reference numeral 1 represents an input terminal to which PCM musical sound data is applied, and 2 shows a correction circuit. The correction circuit 2, which is publicly known in prior art, includes a distortion correction circuit for correcting distortion of PWM, a frequency characteristic correction circuit, and a $\Delta\Sigma$ correction circuit for controlling quantization noise, for the input digital data. Reference numeral 3 designates an envelope detector that detects an envelope of the PCM musical sound data to be applied to the input terminal 1, which in turn is supplied to a level detector 4.

Figure 2:
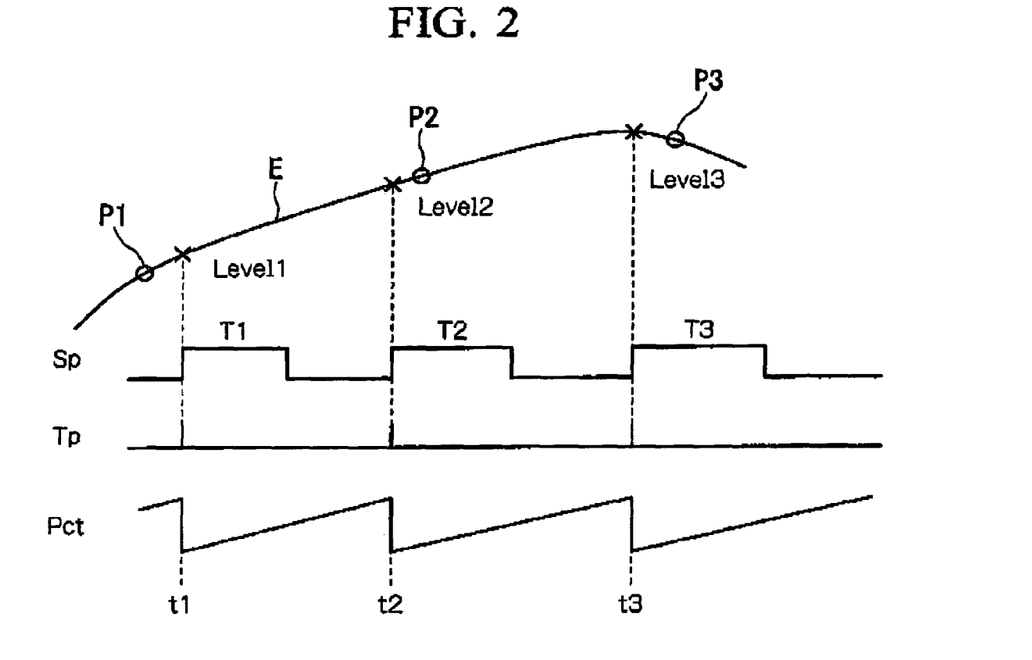
FIG. 2 shows waveforms at each section of the pulse width modulation amplifier of the first embodiment in accordance with the invention.

FIG. 2 shows the PCM musical sound data and the envelope thereof. In FIG. 2, points P1-P3 exemplify the PCM musical sound data. The envelope detector detects an envelope E on which the points P1-P3 are located, which is then provided to the level detector 4. The PCM musical sound data is digital data to be successively supplied to the input terminal 1 at a time interval. The points P1-P3 shows both timing (a horizontal axis) at which the PCM musical sound data is furnished to the input terminal 1 and a level (for example, a voltage level) of the musical sound data (a vertical axis).

As shown in FIG. 2, the level detector 4 detects, at each pulse Tp, levels (Level 1-Level 3) of the envelope from the envelope detector 3. The pulse Tp will be described later. A sampling converter 5 is a circuit for converting a frequency (sampling frequency) of a PWM carrier signal Pct.

The sampling converter 5 includes a level-sampling frequency converter 6 to which the output of the level detector 4 is applied, a PWM carrier generator 7, and an interpolation arithmetic circuit 8. The level-sampling frequency converter 6 converts the voltage level finished by the level detector 4 into frequency data Df representing a sampling frequency, which in turn is applied to the PWM carrier generator 7. In this case, as the output of the level detector 4 is larger, the frequency data Df becomes smaller; as the output of the level detector 4 is smaller, the frequency data Df becomes larger. That is, if the PCM musical sound data at the input terminal 1 is larger (if the digital value of the PCM musical sound data is larger), the frequency data Df becomes smaller. As the PCM musical sound data approaches zero (as the digital value of the PCM musical sound data approaches zero), the frequency data Df becomes larger.

The level-frequency data conversion may be performed based on a conversion table, or an inversely proportional operation according to a predetermined first order equation. Periodic data, not frequency data, may be used. In this case, when an input voltage level is large, a period also becomes large.

The PWM carrier generator 7 generates a pulse signal Tp (shown in FIG. 2) having a frequency corresponding to the frequency data Df, based on a master clock $\Phi$p from a master clock generator 9. The pulse signal Tp is applied to the interpolation arithmetic circuit 8. Moreover, the PWM carrier generator 7 generates the PWM carrier data Pct (shown in FIG. 2) that varies in a serrated shape having the same period as that of the pulse signal Tp. The PWM carrier data Pct provided to a PWM circuit 10. Under the situation, the PWM carrier data Pct becomes "zero" when the pulse signal Tp rises, and after this, increases linearly until the next pulse signal Tp rises, thereby returning to zero, which is repeated having a predetermined period.

In FIG. 2, the variation of the PWM carrier data Pct is shown in an analog waveform. The PWM carrier data Pct may be a triangular waveform, not a serrated waveform.

As described above, the frequency (sampling frequency) of the PWM carrier data Pct is decided by the frequency data Df. To be specific, as the frequency data Df is larger, the sampling frequency becomes larger; as the frequency data Df is smaller, the sampling frequency becomes smaller. That is, because the frequency data Df becomes small when the voltage level of the PCM musical sound data at the input terminal 1 is large, the sampling frequency becomes small. By contrast, because the frequency data Df becomes large when the voltage level of the PCM musical sound data is small, the sampling frequency becomes large.

The interpolation arithmetic circuit 8, which is constructed by, for example, a FIR filter, receives musical sound at the timing of the pulse signal Tp, by way of interpolation operation based on the PCM musical sound data from the correction circuit 2. The musical sound is supplied to the PWM circuit 10. That is, as shown in FIG. 2, the timing at which the PCM musical sound data P1, P2, and P3 is applied to the input terminal 1 does not correspond to that of the pulse signal Tp. Therefore, the interpolation arithmetic circuit 8 calculates the musical sound data at the timing of the pulse signal Tp by using a linear interpolation (bilinear) operation, a polyphase interpolation operation, or a spline interpolation operation. The calculated musical sound data is applied to the PWM circuit 10.

The PWM circuit 10 produces a PWM signal Sp having a pulse width that corresponds to the musical sound data from the interpolation arithmetic circuit 8, based on the PWM carrier data Pct. Namely, when, for example, the data Level 1 is output from the interpolation arithmetic circuit 8 at t1 shown in FIG. 2, the PWM circuit 10 produces the PWM signal Sp at time t1 and then successively compares the PWM carrier data Pct with the data Level 1. When the carrier data Pct corresponds to or exceeds the data Level 1, the PWM circuit 10 gets the PWM signal Sp low.

Next, when the data Level 2 is produced at time t2 from the interpolation arithmetic circuit 8, the PWM circuit 10 gets the PWM signal Sp high again at time t2 and then successively compares the PWM carrier data Pct with the data Level 2. When the PWM carrier data Pct becomes identical with or goes beyond the data Level 2, the PWM circuit 10 makes the PWM signal Sp low.

Since the same series of actions are repeated, the PWM signal Sp having the pulse width T1, T2, T3, . . . that corresponds to the musical sound data Level 1, Level 2, Level 3, . . . , respectively, from the interpolation arithmetic circuit 8 is produced from the PWM circuit 10. The PWM signal Sp is amplified by an amplifier 11 to be applied to a low pass filter 12, through which the PWM signal Sp is converted to an analog signal to be provided to a load such as a speaker.

In the explanation above, the voltage levels of the envelope waveform and the output data from the interpolation arithmetic circuit 8 are treated as the same data (Levels 1-3). In fact, subject to a method of interpolation, there may be a slight difference in data.

As explained above, with regard to the pulse width modulation amplifier in accordance with the embodiment, a sampling frequency of tee pulse signal Tp and the PWM carrier data Pct is determined based on the voltage level of an envelope of the PCM musical sound data to be input. When the level of the PCM musical sound data to be input is large, a sampling frequency is small; when the level of the PCM musical sound data is small, a sampling frequency is large.

Figure 3:
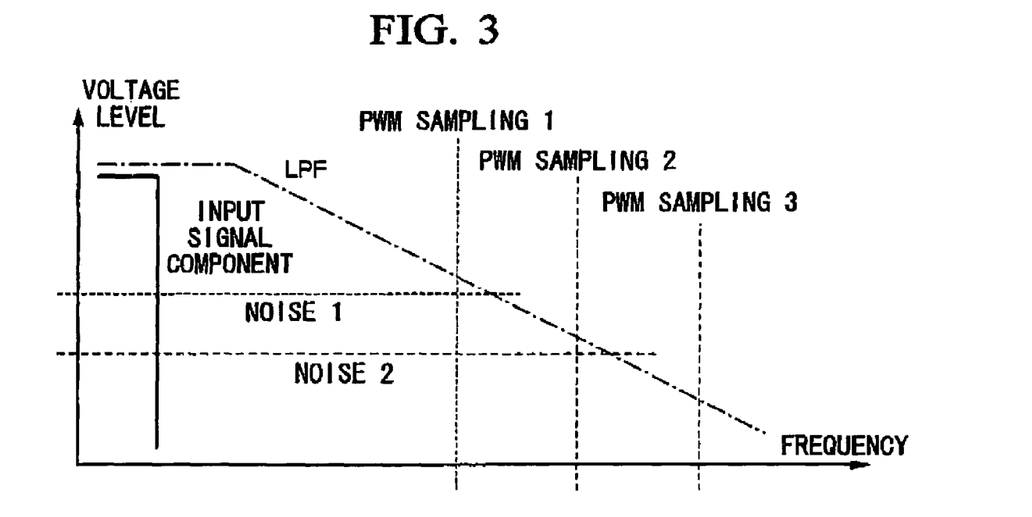
FIG. 3 is a diagram for illustrating effects produced by the pulse width modulation amplifier of the first embodiment in accordance with the invention.

FIG. 3 is a diagram for illustrating effects produced by the pulse width modulation amplifier of the first embodiment in accordance with the invention. A cutoff frequency of the low pass filter 12, as shown in FIG. 3, is set to be lower than any of the sampling frequencies, which reduces noise caused by jitter accompanied by the PWM carrier. The noise reduction, as is apparent from the figure, is more effective as the sampling frequency becomes higher. However, higher sampling frequencies for the carrier cannot provide a sufficient drive signal because of a higher drive voltage for an output driver, which leads to worse efficiency. Therefore, according the embodiment of the invention, when the level of the PCM musical sound data is small, the sampling frequency for the carrier is made higher to reduce noise. When, on the other hand, the level of the PCM musical sound data is large, the sampling frequency for the carrier is made lower because noise has a weak influence, thus improving efficiency.

Some specific examples of the embodiment will be described.

Figure 4:
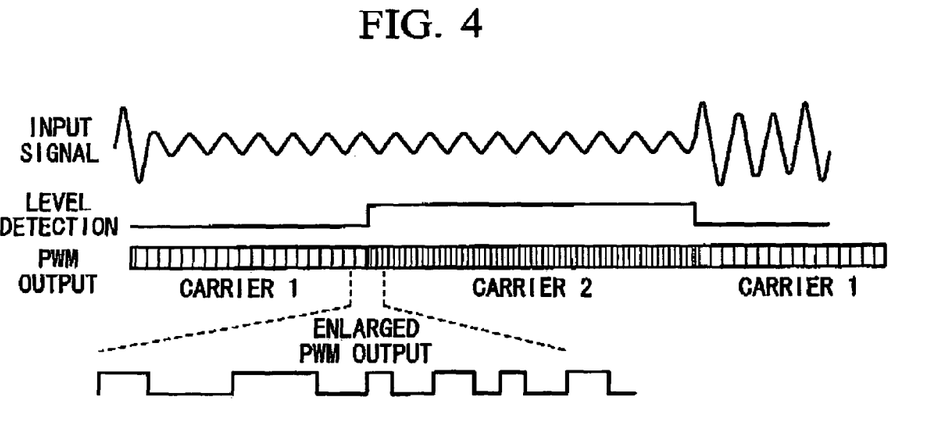
FIG. 4 shows waveforms for illustrating a first input signal for the pulse width modulation amplifier of the first embodiment in accordance with the invention.

FIG. 4 shows waveforms for illustrating a first input signal for the pulse width modulation amplifier in accordance with the first embodiment. As shown in FIG. 4, in a case where the PCM musical sound data to be input becomes smaller, for example, in a case where upper 8 bits consists only of code information and some time has elapsed, a sampling frequency of the PWM carried is doubled. When the PCM musical sound data has become larger once again, the doubled sampling frequency is immediately restored to the previous sampling frequency. In this way, in this example, the sampling frequencies are controlled at two stages.

The sampling frequency of the PCM musical sound data is identical with and synchronized with that of the PWM carrier. In this example, when the voltage level of the PCM musical sound data is low, the sampling frequency of the carrier is multiplied by two. At this time, in order to compensate for insufficient data, the musical sound data may be applied to the PWM circuit 10 with the same values repeated twice, or be interpolated by using linear interpolation or second order interpolation. Alternatively, the PCM musical sound data may be regarded as data owing to a high sampling frequency to be used at some intervals when applied to the PWM circuit 10.

Figure 9:
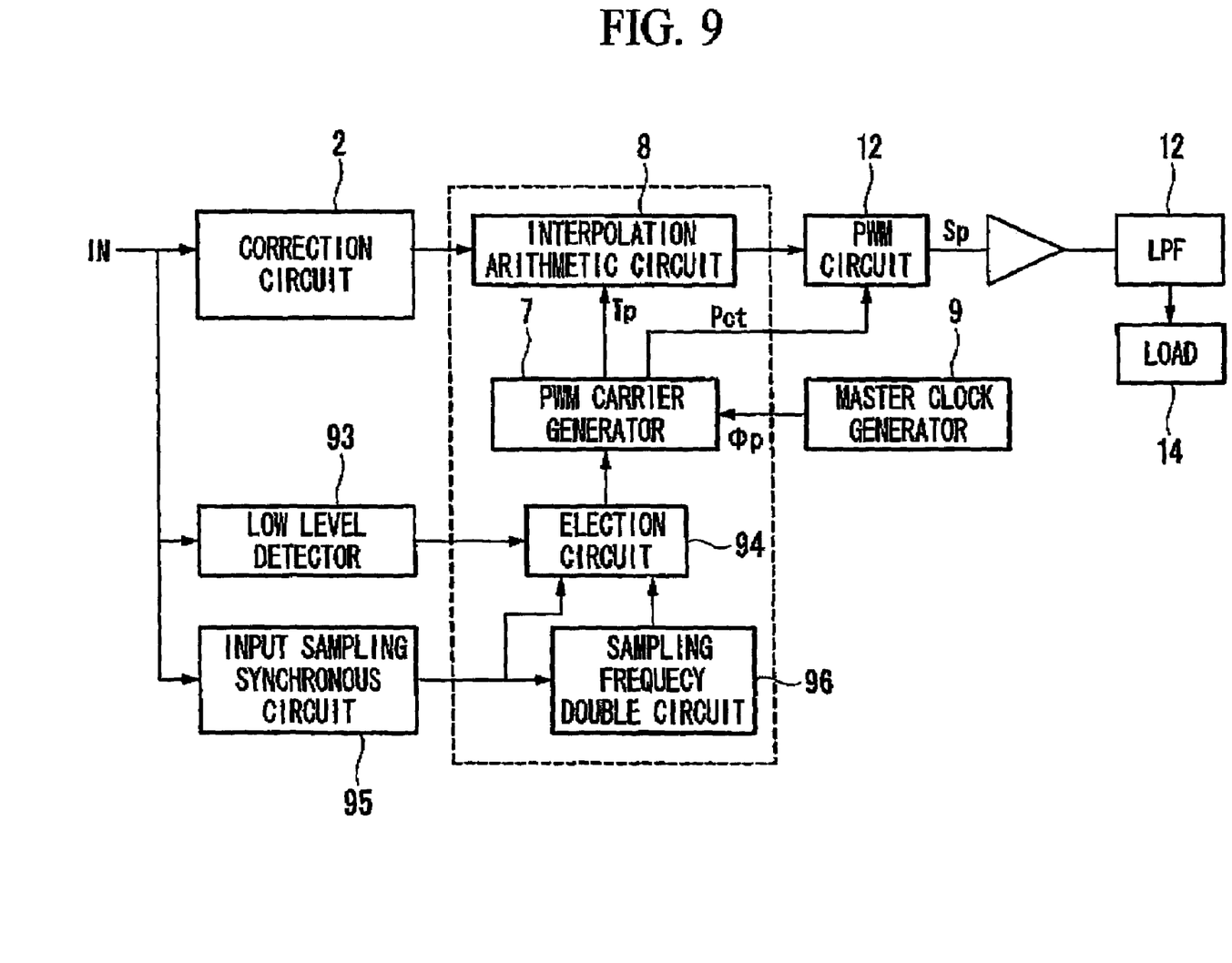
FIG. 9 is a block diagram for illustrating a variant of the pulse width modulation amplifier of the first embodiment shown in FIG. 1.

FIG. 9 is a block diagram for illustrating a variant of the pulse width modulation amplifier of the first embodiment shown in FIG. 1. As shown in FIG. 9, input fling (word timing) is detected from the input data by an input sampling synchronous circuit 95. When synchronous timing (such as word clock) is inserted into the input data, the synchronous timing may be used. The sampling frequency from the input sampling synchronous circuit 95 is applied to both an election circuit 94 and a sampling frequency double circuit 96. The sampling frequency double circuit 96 doubles and produces a sampling frequency, which is to be fed to the election circuit 94. The election circuit 94 switches over its output in response to an output of a low level detector 93.

Figure 5:
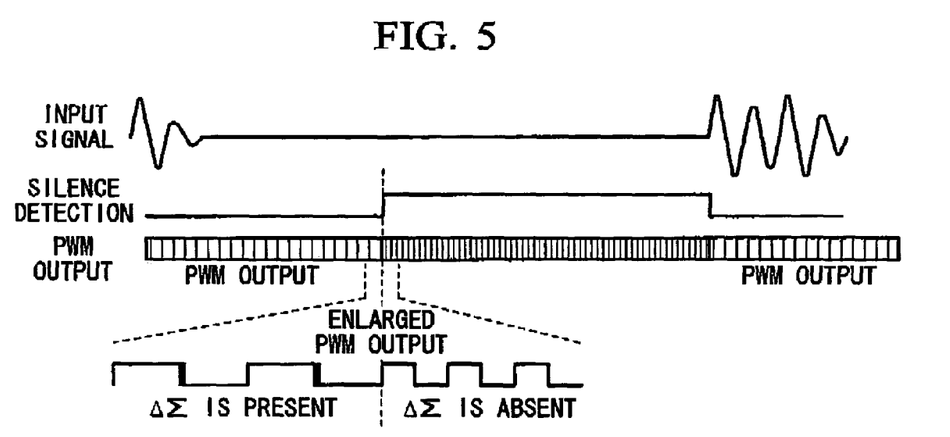
FIG. 5 shows waveforms for illustrating a second input signal for the pulse width modulation amplifier of the first embodiment in accordance with the invention.

FIG. 5 shows waveforms for illustrating a second input signal for the pulse width modulation amplifier of the first embodiment in accordance with the invention. As shown in FIG. 5, when the PCM musical sound data is silent data in which data "0" appears successively, the ΔΣ correction action of the correction circuit 2 is turned off. In the PWM circuit 10, when the sampling frequency of the carrier is raised to the limit with a fixed duty of 50%, noise (sounds "hissing") at the time of silent data can be reduced.

However, because there is data "+1" or "−1" except for "0" as silent data, when data −2-+2 is successively applied to the input terminal 1, the data applied is treated as silent data to be switched over to the above fixed pattern. When DC data is applied to the input 1, the ΔΣ correction action, likewise; is turned off. The output from the PWM circuit 10 of a fixed pattern having a raised sampling frequency enables noise reduction.

A second embodiment in accordance with the invention will be described below.

Figure 6:
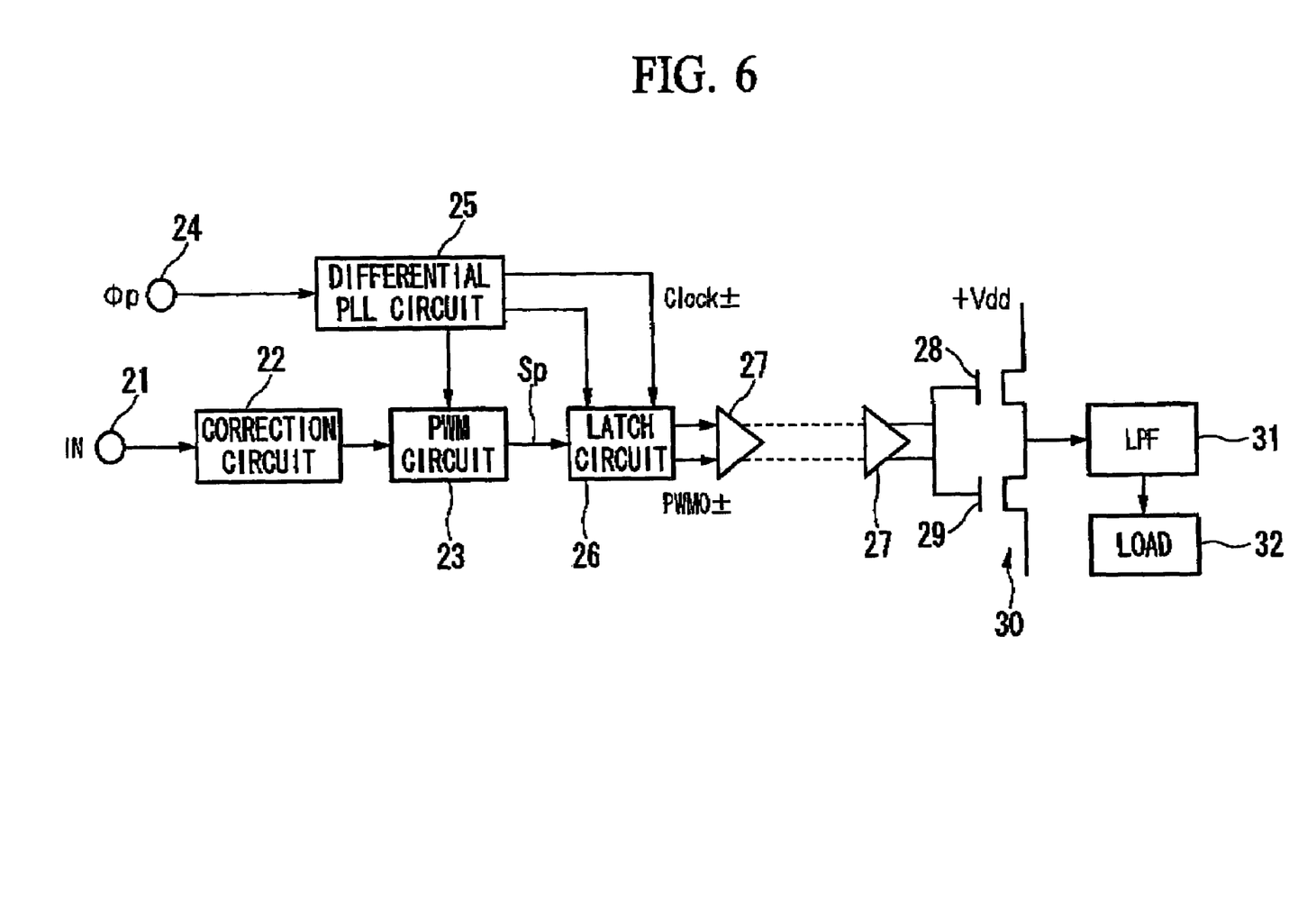
FIG. 6 is a block diagram for illustrating a structure of a pulse width modulation amplifier of a second embodiment in accordance with the invention.

FIG. 6 is a block diagram for illustrating a structure of a pulse width modulation amplifier of the second embodiment. In FIG. 6, reference numeral 21 represents an input terminal to which the PCM musical sound data is applied. Reference numeral 22 designates a correction circuit that is the same as the correction circuit 2 in FIG. 1. The musical sound data output is supplied to a PWM circuit 23. Reference numeral 24 represents an input terminal to which the master clock Φp is applied. Reference numeral 25 denotes a differential PLL (phase locked loop). The differential PLL multiplies the master clock Φp and outputs the multiplied master clock as a differential clock pulse. One phase of the clock pulse is supplied to the PWM circuit 23, while the differential clock pulse is provided to a latch circuit (also referred to as a "latch") 26.

Figure 7:
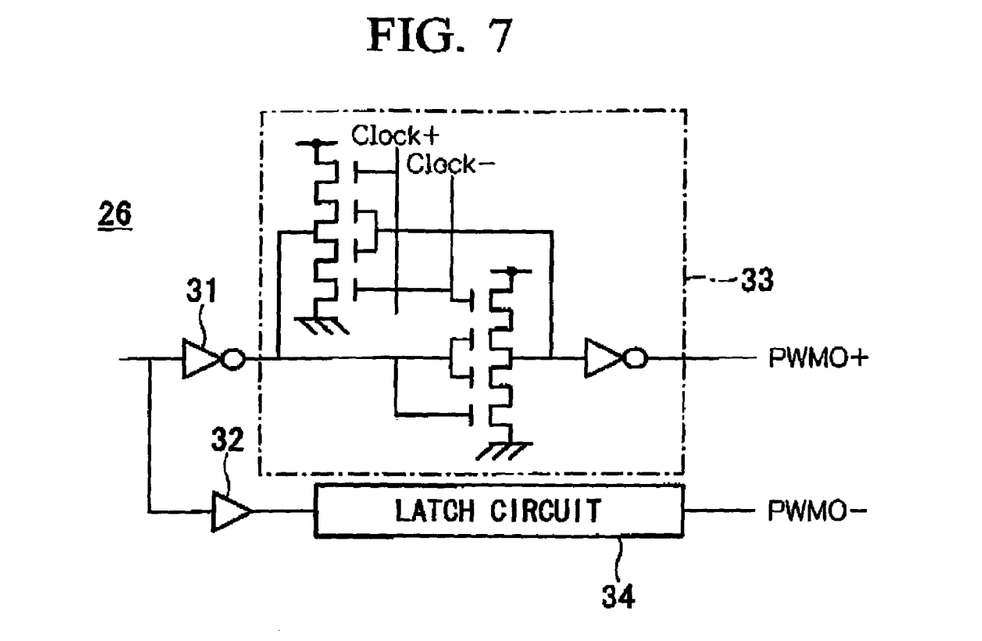
FIG. 7 is a circuit diagram illustrating a structure of a latch in the pulse width modulation amplifier of the second embodiment in accordance with the invention.

The PWM circuit 23 generates a PWM carrier data that successively increases in serrated form, based on the clock pulse from the differential PLL 25. The generated data is compared with the musical sound data from the correction circuit 22, which produces a PWM signal Sp (see FIG. 2) to be supplied to the latch 26. The latch 26 latches the PWM signal Sp based on the differential clock pulse from the differential PLL 25. The latched signal is output as a differential PWM signal FIG. 7 is a circuit diagram illustrating a of a latch 26 in the pulse width modulation amplifier of the second embodiment. In the figure, reference numeral 31 represents an inverter for inverting and amplifying the PWM signal Sp for its output. Reference numeral 32 shows an amplifier for amplifying the PWM signal Sp for its output. Reference numerals 33 and 34 designate a latch circuit having an identical structure, respectively. The latch circuits 33 and 34 read in each of the outputs of the inverter 31 and the amplifier 32, restively, at the timing of varying differential clocks Clock± from the differential PLL circuit 25 to deliver their differential outputs PWMCO± to a subsequent stage of an amplifier 27.

Reference numerals 27, 27, . . . represent amplifiers which amplify an output of the latch 26 to supply the differential outputs PWMO± to a differential driver 30 including two FETs (field effect transistor) 28 and 29. The differential driver 30, which has two FETs 28 and 29 serially connected, amplifies the output from the amplifier 27. The amplified signal is provided to a load 32 via a low pass filter (LPF) 31.

Figure 8A:
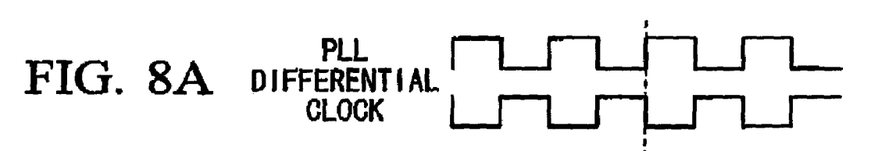
FIG. 8A shows waveforms of PLL differential clocks of the pulse width modulation amplifier of the second embodiment in accordance with the invention.
Figure 8B:
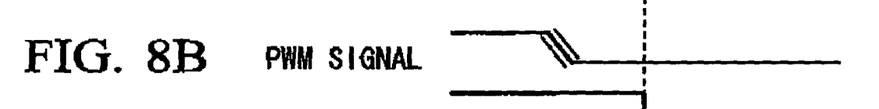
FIG. 8B shows waveforms of a PWM signal of the pulse width modulation amplifier of the second embodiment in accordance with the invention.
Figure 8C:
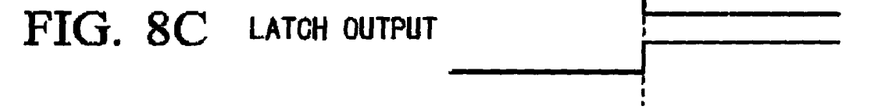
FIG. 8C shows waveforms from the outputs of a latch of the pulse width modulation amplifier of the second embodiment in accordance with the invention.
Figure 8D:
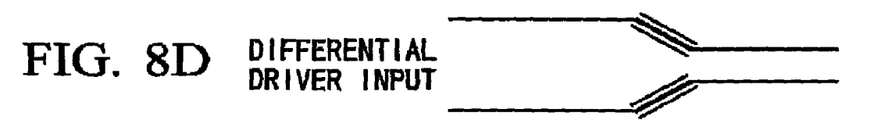
FIG. 8D shows waveforms to the inputs of a differential driver of the pulse width modulation amplifier of the second embodiment in accordance with the invention.
Figure 8E:
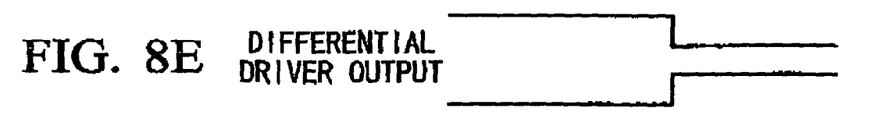
FIG. 8E shows waveforms from the output of a differential driver of the pulse width modulation amplifier of the second embodiment in accordance with the invention.

FIGS. 8A-8E show waveforms at each section of the pulse width modulation amplifier in accordance with the second embodiment. FIG. 8A shows waveforms of PLL differential clocks of from the differential PLL circuit 25. FIG. 8B shows waveforms of a PWM signal Sp from the PWM circuit 23. As shown in this figure, the PWM signal Sp includes jitter that is produced at the time of the PWM conversion. FIG. 8C shows waveforms from the outputs of the latch 26, which reads in the PWM signal Sp at the timing of the differential clock shown in FIG. 8A. The reading in eliminates the jitter contained in the PWM signal Sp. FIG. 8D shows waveforms to the inputs of the differential driver 30. The waveforms includes noise generated by the amplifiers 27, 27, . . . , most of which is common mode. FIG. 8E shows waveforms from the output of the differential driver 30. Since the noise generated by be amplifiers 27 is offset by a series circuit of the FETs 28 and 29, the signal from the differential driver 30 is supplied to the LPF 31 with the noise largely attenuated.

A third embodiment in accordance with the invention will be described below.

Figure 10:
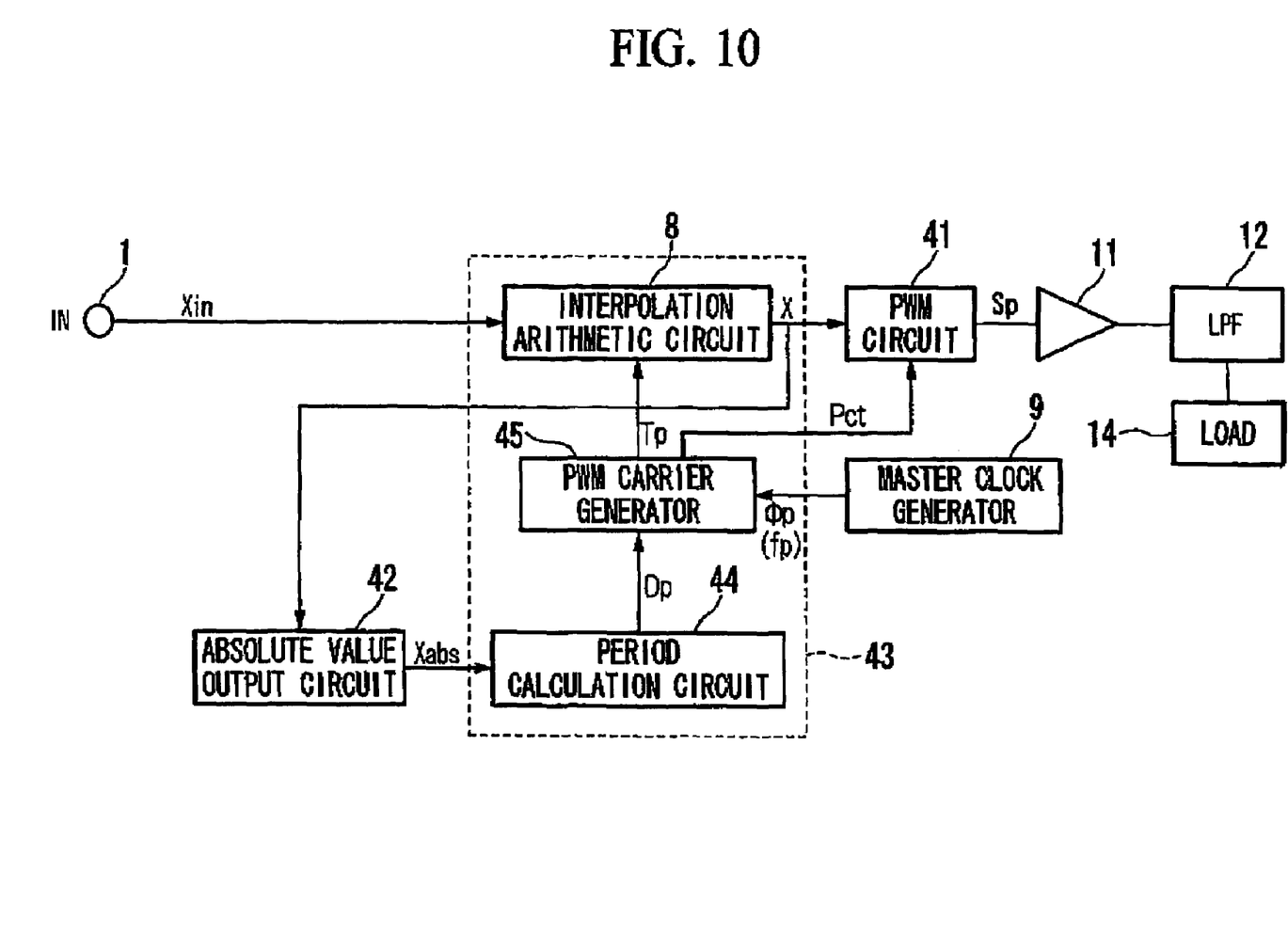
FIG. 10 is a block diagram for illustrating a structure of a pulse width modulation amplifier of a third embodiment in accordance with the invention.

FIG. 10 is a block diagram for illustrating a structure of a pulse width modulation amplifier of the third embodiment in accordance with the invention. In the figure, the same reference numerals are assigned to the structural elements that are the same as those in FIG. 1.

In the figure, reference numeral 1 designates the input terminal to which musical sound Xin is applied. The musical sound Xin is interpolated and processed by the interpolation arithmetic circuit 8, as described above regarding FIG. 1, and the processed signal is supplied to a PWM circuit 41. This PWM circuit 41 converts an output X from the interpolation arithmetic circuit 8 to a pulse width modulation signal Sp, which is fed to the load 14 such as a speaker, via the amplifier 14 and the LPF.

A reference numeral 42 is a absolute value output circuit, which receives data X from the interpolation arithmetic circuit 8, supplies an absolute value of data X, i.e., Xabs to a period calculation circuit 44 in a sampling convert 43. The period calculation circuit 44, according to the following equation, calculates periodic data Dp that varies responsive to the value of musical sound data Xin, from the absolute value Xabs and a constant H. Then, the calculated results are fed to a PWM carrier generator 45.

$$Dp = H + Xabs$$

In the embodiment, the range of is determined by the following.

$$-512 < Xin < +512$$

The constant H is set as follows as a maximum value of the musical sound data Xin.

$$H = 512$$

The PWM carrier generator 45 generates a pulse signal Tp whose period is Dp/fp (the period is 1/fp multiplied by Dp) based on the master clock signal Φp from the master clock generator 9, where the master clock signal Φp has a frequency fp. The generated pulse signal Tp is then applied to the interpolation arithmetic circuit 8.

Moreover, the PWM carrier generator 45 also generates a PWM carrier data Pct (refer to FIG. 11B) that varies in a serrated shape having the same period as the pulse signal Tp. The PWM carrier data Pct is applied to the PWM circuit 10. This carrier data Pct becomes zero when the pulse signal Tp goes high and then increases linearly with a constant slope with respect to time.

The process by the PWM circuit 41 will be described below.

Figure 11A:
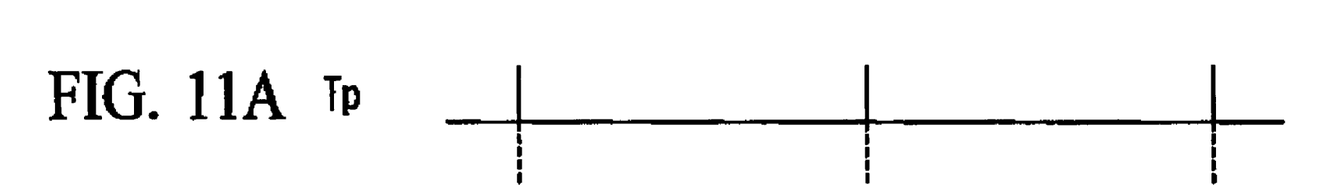
FIG. 11A shows a pulse signal Tp of the output of a PWM carrier generator of a pulse width modulation amplifier of a third embodiment in accordance with the invention.
Figure 11B:
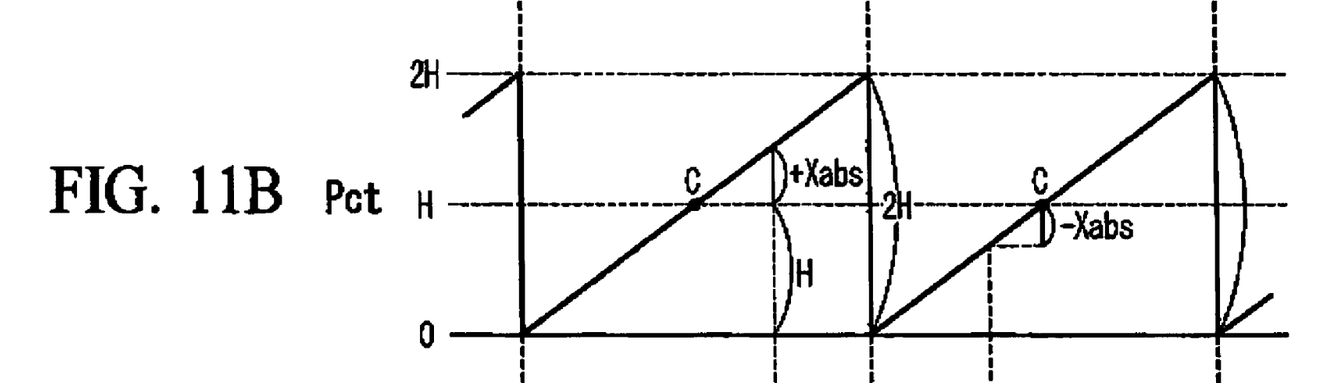
FIG. 11B shows PWM carrier data Pct of the output of the PWM carrier generator of the pulse width modulation amplifier of the third embodiment in accordance with the invention.
Figure 11C:
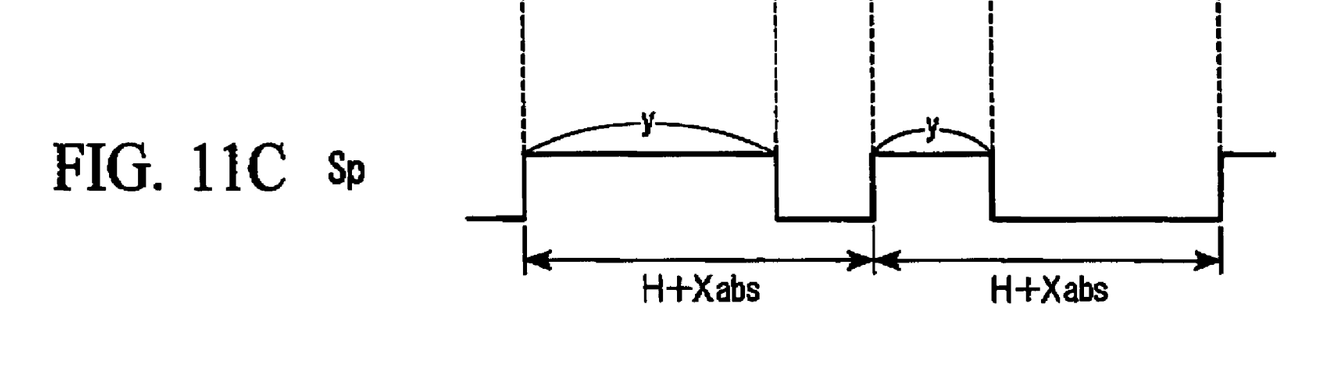
FIG. 11C shows a PWM signal Sp of the output of a PWM circuit of the pulse width modulation amplifier of the third embodiment in accordance with the invention.

FIG. 11A shows the pulse signal Tp of the output of the PWM carrier generator 45 of the pulse width modulation amplifier of the embodiment FIG. 11B shows the PWM carrier data Pct of the output of the PWM carrier generator 45. FIG. 11C a PWM signal Sp of the output of the PWM circuit 41.

Assuming that the pulse width of the PWM signal generated corresponding to the data X is designated as "y" (see FIG. 11C), the duty of the PWM signal is determined the following equation.

$$duty = y/(H+Xabs)$$

Since the peak value of the serrated waveform is 2H and the value at a center C corresponding to the data X=0 is H, the following equation is obtained.

$$y/(H+Xabs) = (H \pm Xabs)/2H$$

From this equation, a pulse width y+ when the data X is positive is expressed by the following equation.

$$y+ = (H2 + 2HX + X2)/2H = H/2 + X + X2/2H$$

Another pulse width y− when the data X is negative is derived by the following equation.

$$y- = (H^2 - X^2)/2H = H/2 - X^2/2H$$

The PWM circuit 41 calculates the pulse width by using the above equations for y+ and y−, and using the calculated results, generates and outputs the PWM signal Sp. Since the process (circuits) for executing the equations can be constructed only by squaring and bit shifting, a digital signal processor (DSP) can be used, which leads to an easy construction and an easy realization by hardware. The construction of the embodiments enables an easy contraction of the PWM modulator according to an input level.

Although the data to be input is explained as PCM musical sound data in the description for the embodiments above, the invention is not limited to the PCM musical sound data. The invention is applicable to other types of data such as speech sound and can be used in an audio visual amplifier.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A pulse width modulation amplifier comprising:
   an absolute value output circuit for outputting an absolute value of digital data;
   a period data output circuit for outputting period data corresponding to the absolute value from the absolute value output circuit;
   a carrier generator for generating a carrier signal having a frequency which is a function of the period data; and
   a converter for converting the digital data to a pulse width modulation signal based on the carrier signal.

2. A pulse width modulation amplifier as recited in claim 1, wherein the converter decides a pulse width y of the pulse width modulation signal based on the following equation $$y/(H+Xabs) = (H \pm Xabs)/2H,$$

where H is a maximum value of the digital data, and Xabs is an absolute value of the digital data.

3. A pulse width modulation amplifier as recited in claim 1, wherein the carrier signal periodically varies in a serrated shape.

* * * * *